United States Patent [19]

Ballantyne et al.

[11] 4,399,417
[45] Aug. 16, 1983

[54] INTEGRATED CRC FILTER CIRCUIT

[75] Inventors: James P. Ballantyne, Wyomissing Hills, Pa.; Paul E. Fleischer, Little Silver, N.J.; Kenneth R. Laker, Staten Island, N.Y.; Aristides A. Yiannoulos, Wyomissing Hills, Pa.

[73] Assignee: Bell Telephone Laboratories, Incorporated, Murray Hill, N.J.

[21] Appl. No.: 157,452

[22] Filed: Jun. 6, 1980

[51] Int. Cl.³ ............... H01L 29/94; H01L 27/04; H03H 7/01
[52] U.S. Cl. ............... 330/109; 330/306; 333/172; 357/14; 357/23; 357/51; 357/59
[58] Field of Search ............ 357/51, 23 C, 23 D, 357/59, 14; 333/172; 330/109, 306

[56] References Cited

U.S. PATENT DOCUMENTS

| | | | |
|---|---|---|---|
| 3,953,875 | 4/1976 | Cave et al. | 357/51 |
| 4,092,619 | 5/1978 | Huggins | 357/51 |
| 4,143,387 | 3/1979 | Stikvoort | 357/51 |
| 4,233,615 | 11/1980 | Takemoto et al. | 357/51 |
| 4,285,001 | 8/1981 | Gerzberg et al. | 357/51 |

OTHER PUBLICATIONS

Gray et al., IEEE J. of Solid State Circuits, vol. SC14, No. 6, Dec. 1979, pp. 981-990.

Primary Examiner—William D. Larkins
Attorney, Agent, or Firm—H. W. Lockhart; Arthur J. Torsiglieri

[57] ABSTRACT

A capacitor-resistor-capacitor (CRC) element for active filter realization, which is fully integrable and compatible with MOS technology, is described. The incorporation of the CRC element in a semiconductor integrated circuit active filter also is described. The structure of the CRC filter element is closely analogous to a depletion mode MOS field effect device, except that the channel zone 26 is doped to a level which substantially precludes conductivity modulation at the usual operating voltages. However, the doping level is such as to enable the use of the channel zone as a semiconductor resistance element. Thus, the N-channel CRC element realized in the NMOS technology comprises a first capacitance composed of the gate 27, gate dielectric 38, and resistive channel 26, paralleled by the resistive channel 26 itself constituting a resistor, and then the underlying PN junction capacitance between the N-type resistive channel 26 and the underlying P-type semiconductor body portion 21. An active low-pass filter consists of two CRC elements and an operational amplifier and utilizes the positive feedback principle.

4 Claims, 2 Drawing Figures

INTEGRATED CRC FILTER CIRCUIT

BACKGROUND OF THE INVENTION

This invention relates to semiconductor integrated active filter circuits and more particularly, to such a circuit including distributed capacitor-resistor-capacitor (CRC) elements fabricated using MOS technology.

Resistors and capacitors as integral, but discrete, elements in semiconductor integrated circuits are well known. Resistors are fabricated within the bulk semiconductor material, on polysilicon material deposited on the surface of the device, or as thin film elements on both semiconductor and other substrates. Capacitors may be of the well-known MOS configuration or may utilize the multilevel conducting and insulating layers provided for semiconductor device interconnection on the surface of the device. The use of PN junction capacitance for various applications also is known. U.S. Pat. No. 4,092,619 discloses an MOS field device for use as a voltage controlled low-pass filter. However, integrated circuit resistors and capacitors often lack the linearity required for active filter performance. Or, in order to achieve the required linearity, the elements must be of a size which uses an inordinate amount of space in the semiconductor device. The dimensions of such elements might even preclude their integration. There are further difficulties, using MOS technology, in fabricating capacitors and resistors with adequate control of the performance characteristics of these elements.

It is important also in meeting the foregoing problems that the method of fabricating such passive elements departs as little as possible from the standard processing of the technology used to make the semiconductor integrated circuits.

Thus, there is a need for integrable capacitive and resistive components which are compact and are easily fabricated to precise parameters. Such elements advantageously should exhibit linear characteristics over their useful range. Such elements should be susceptible of facile integration into filter configurations for a variety of applications.

SUMMARY OF THE INVENTION

In a preferred embodiment in accordance with the invention, a distributed capacitor-resistor-capacitor (CRC) element comprises an MOS-like structure with the difference, however, that the implanted channel region is doped to a level which substantially precludes conductivity modulation. However, the doping level of the channel is sufficiently low to enable its use as an efficient linear resistor. Moreover, since the channel-to-substrate PN junction provides another capacitance, a laterally distributed, vertically compounded CRC element is formed from the top gate member to the substrate.

More specifically, as embodied in N-channel MOS technology, a CRC filter element in accordance with this invention has a channel from about one to two microns deep, implanted so as to have a resistivity of between 200 and 600 ohms per square. At this doping level, and for the typical gate-to-channel voltages of between ±10 volts, there is substantially no conductivity modulation in the channel. The device therefore does not function as a field effect device, although there is a capacitive coupling from gate to channel and channel to substrate.

The N-type zones at the ends of the channel, which are the counterparts of source and drain, comprise the terminal zones of the resistor formed by the channel. Ohmic electrodes are provided to these terminal zones as well as to the portion of the semiconductor body of opposite conductivity type. A fourth connection is made to the conductive layer overlying the dielectric on top of the channel; that is, the gate in MOS terms.

The distributed CRC structure thus described is an advantageously compact filtering element structure which is fabricated by the addition of, to standard MOS technology, a photoresist-masked impurity implantation process. Significantly, the additional processing does not include any high temperature treatment.

More specifically, typically for fabrication of the invention, following the definition of device topology and during the threshold adjustment step, a special step is included requiring an additional photoresist mask to define only the channel zones of the CRC elements. Then, using the photoresist as a mask, an impurity implantation step produces the appropriate doping level in the channel. Mask alignment for this step is a relatively uncritical process.

This CRC filter element may be used for realizing in a variety of integrated active filter circuits. As such, it is particularly suited, for example, to provide a filter which is an on-chip, antialiasing protection circuit for switched capacitor networks. In particular, two distributed CRC elements connected in a network with one operational amplifier in the noninverting unity gain configuration, and including a positive feedback connection, compose a "Sallen and Key" type low-pass filtering unit.

Accordingly, an object of the invention is a distributed CRC filter element fully integrable on a semiconductor integrated circuit chip to constitute the passive component of an integrated active filter unit.

Ancillary to that object are resistive and capacitive components of filter elements which are highly linear in their response and whose manufacture is highly controllable.

BRIEF DESCRIPTION OF THE DRAWING

The invention and its other objects and features will be more clearly understood from the following detailed description taken in conjunction with the drawing in which.

DETAILED DESCRIPTION

Figure 1:
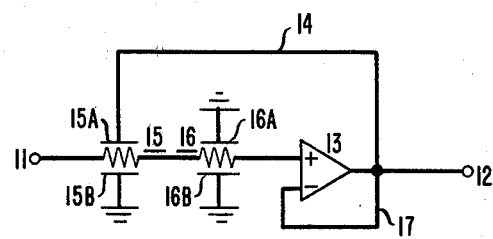
FIG. 1 is a circuit schematic of a "Sallen and Key" type antialiasing circuit incorporating a pair of CRC elements of a type in accordance with the invention.

The circuit configuration shown in FIG. 1 is an extended form of the "Sallen and Key" low-pass type filter in accordance with this invention. It is particularly suitable, for example, for use in antialiasing protection in switched capacitor networks of the type disclosed in the copending application, Ser. No. 100,293 filed Dec. 5, 1979, by P. E. Fleischer and K. R. Laker and assigned to the same assignee as this application.

As shown, the circuit consists of an operational amplifier 13 having an output terminal 12, a negative feedback connection 17, and a positive feedback connection 14 to the gate terminal 15A of CRC element 15. The substrate junction capacitor terminal 15B of the CRC element 15 is connected to AC ground, and the resistor of the element 15 has one terminal connected to input terminal 11 and the other to the resistor of CRC element 16. AC ground normally is the substrate power supply lead, typically to a −5 volt supply. The other end of the resistor of CRC element 16 is connected to the input of the operational amplifier 13. The substrate capacitor terminal 16B of CRC element 16 is connected to AC ground, as in the case of CRC element 15, and the gate terminal 16A may be connected to DC, "hard", ground.

Figure 2:
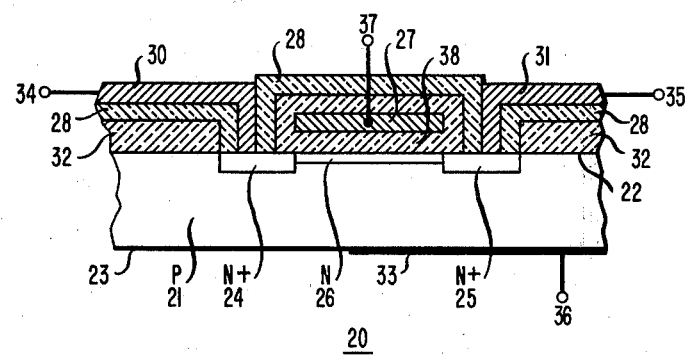
FIG. 2 is a cross-sectional view of a portion of a semiconductor I.C. chip which includes a single CRC, NMOS technology, N channel element in accordance with a preferred embodiment of the invention.

The CRC elements 15 and 16 in the circuit of FIG. 1 advantageously may be incorporated, along with the operational amplifier, in an integrated circuit chip made in accordance with N-channel, P-channel, or complementary MOS technology. In N-channel technology, the CRC elements 15 and 16 are implemented as depicted in FIG. 2.

The device in the semiconductor body 20 has the appearance of a conventional depletion-mode N-channel MOS transistor with, however, some significant differences both in structure and operation. The body 20 is a sectional view of a part of semiconductor chip which is one of a large number of chips fabricated in a silicon semiconductor wafer in accordance with techniques well known in the art. The bulk portion 21 of the semiconductor body 20 is of P-type conductivity monocrystalline silicon. The body 20 has an upper major surface 22 and a lower major surface 23. Alternatively to the embodiment of FIG. 2, the P-type conductivity portion 21 may comprise a P-type epitaxially grown layer on top of a single crystal silicon starting portion typically of P-type conductivity. However, in either case the semiconductor body has a P-type conductivity portion 21 adjoining the upper major surface 22.

In a specific embodiment, the P-type portion 21 has a resistivity of from about 7 to 15 ohm cm. High conductivity N-type zones 24 and 25 constitute a pair of spaced-apart zones within the P-type portion 21 and adjacent the upper major surface 22. The similarity of zones 24 and 25 to the source and drain of an MOS field effect transistor is apparent.

Extending between the zones 24 and 25 is the N-type conductivity surface-adjacent zone 26 which is the counterpart of the channel of a depletion mode field-effect device. However, the zone 26 which, in this specific embodiment has a depth from the surface 22 of one to two microns, contains a level of impurity such that for the customary range of operating voltages, depletion of carriers sufficient to effect conductivity modulation of this zone is substantially precluded. Typically in devices of this type, voltages applied from the gate to the channel do not exceed about 10 volts positive or negative. The impurity level in the zone 26 provides, advantageously, a resistivity in the range of from about 200 to 600 ohms per square. For this specific embodiment, a value of 400 ohms per square is used, and thus the resistivity level of zone 26 is such as to constitute a satisfactory linear resistance element having terminal zones 24 and 25. Consequently, to realize a low pass filter to provide 45 dB of rejection at 200 kilohertz, element 15 of the circuit of this specific embodiment is typically 8 μm wide by 10,500 μm long, and element 16 is typically 8 μm by 3,100 μm long.

Overlying the upper surface 22 are conventional layers of dielectric and conductive material of the type usually employed in MCS semiconductor devices. Adjoining the surface 22 outlying from the device itself is the oxide layer 32 generally termed the "field oxide", which is of a greater thickness than the gate oxide. The gate oxide 38 has a portion immediately overlying the zone 26. In the design being discussed, the thickness of this gate oxide was 750 Angstroms and consistent with the thickness of the other gate oxides on the chip. The gate electrode 27 overlies the gate oxide 38 in general alignment with the zone 26. Conductive layer 30 is ohmically connected to terminal zone 24, and similarly conductive layer 31 is connected to terminal zone 25. The conductive layers 27, 30, and 31 comprising the gate and terminal zone interconnections may be of a conductive metal such as aluminum or may be conductive polycrystalline silicon. The connection is made to the underlying P-type conductivity portion 21 by means of ohmic electrode 33 to the lower major surface 23. The layer 28 shown overlying both field and gate oxide layers is a layer of phosphorus-containing oxide known as P-glass, included for the purpose of device passivation. Terminal 37 from the gate electrode 27 typically is formed at a convenient location out of the plane of the cross-section of FIG. 2. Likewise, terminals 34 and 35 to the resistor may be formed at a remote location. Thus, the device is a four-terminal element comprising the terminals 34 and 35 to the resistance element, terminal 37, to the gate to form the upper capacitive coupling and lead 36 which is customarily connected to the most negative power supply lead which, for filter applications, constitutes an AC ground connection.

The fabrication of the embodiment shown in FIG. 2 follows conventional practice for the fabrication of depletion mode N-channel MOS devices with the variation that an additional special threshold adjustment step is employed with respect to those devices which are to be fabricated as CRC filter elements. This step comprises a separate photoresist masking operation to expose only that portion of the surface 22 overlying the zone 26 followed by an ion implantation, which introduces an N-type impurity to produce the desired doping level. Specifically in this embodiment, arsenic is ion implanted at a dosage of $3 \times 10^{14}$ ions per square cm using an energy beam of 30 kev. This is a relatively uncritical masking step, and no special heat treatment beyond that which occurs in the subsequent processing of the wafer and which is sufficient to effect the other threshold adjustments is required. Thus, in effect, the processing change is a transparent one which, however, enables the fabrication with a high degree of control of a CRC filter element having the desired linearity of its constituent parts.

The CRC element in accordance with the invention also may be fabricated, if desired, as a P-channel MOS structure with appropriate reversal of conductivity type and adjustment of impurity concentrations. Thus, the invention may be incorporated advantageously in semiconductor integrated circuits of PMOS or CMOS technology. When used in CMOS technology, there is some advantage in fabricating the CRC filter element in the technology of the device type in the isolation tub.

We claim:
1. A filter circuit comprising,
   first and second integrated capacitor-resistor-capacitor elements, each element comprising, a semiconductive body having a bulk portion of one conductivity type, a pair of spaced surface zones of the opposite conductivity type and of relatively low resistivity, and a localized surface channel of said opposite conductivity type and of relatively high resistivity extending between said spaced zones, a dielectric gate layer overlying said channel, a conductive gate layer overlying said dielectric gate layer, separate terminal connections to each of said spaced zones, the bulk portion and the conductive gate layer, the doping of said channel and the thickness of the dielectric layer being so related that in the operating voltage range of between plus or minus ten volts between said channel and said conductive gate means the resistivity of said channel is substantially independent of such voltage, the pair of terminals to the spaced zones providing therebetween a useful filter circuit resistance, and each of the pairs of terminals consisting of one from the connections to the spaced zones and the other from a connection to either the conductive layer or the bulk providing therebetween a useful filter circuit capacitance, the two elements having their terminals interconnected so that their channels are in series, and an operational amplifier configured to operate in the noninverting unity gain mode and having an input and an output terminal, its input terminal being connected to the end terminal of the second of the series connected channels and its output terminal being connected to the conductive gate terminal of the first of the two elements.

2. A filter circuit comprising, first and second circuit elements each comprising a semiconductive body portion having a bulk of one conductivity type, a pair of spaced surface zones of the opposite conductivity type and of relatively low resistivity, and a localized surface channel of said opposite conductivity type and of relatively high resistivity extending between said spaced zones, a dielectric gate layer overlying said channel, a conductive gate layer overlying said dielectric layer, separate terminal connections to each of said spaced zones, the bulk portion and the conductive gate layer, the doping of said channel and the thickness of the dielectric layer being so related that in the range of between plus or minus ten volts between said channel and said conductive gate the resistivity of said channel is substantially independent of such voltage, an operational amplifier configured to operate in the noninverting unity gain mode and having an input and an output terminal, means interconnecting the two circuit elements to connect their two channels serially, means interconnecting the end terminal of the second of the elements to the input of the operational amplifier, and means interconnecting the output of the operational amplifier to the conductive gate terminal of the first of the two elements.

3. In combination a semiconductive integrated capacitor-resistor-capacitor filter adapted for use in a filter circuit comprising, a semiconductive body having a bulk portion of one conductivity type, a pair of spaced surface zones of the opposite conductivity type and of relatively low resistivity, and a localized surface channel of said opposite conductivity type and of relatively high resistivity extending between said spaced zones, a dielectric gate layer overlying said channel, a conductive gate layer overlying said dielectric gate layer, separate terminal connections to each of said spaced zones, the bulk portion and the conductive gate layer, the doping of said channel and the thickness of the dielectric layer being so related that in the operating voltage range of the input means the resistivity of said channel is substantially independent of such voltage, the pair of terminals to the spaced zones providing therebetween a useful filter circuit resistance, and each of the pairs of terminals consisting of one from the connections to the spaced zones and the other from a connection to either the conductive layer or the bulk providing therebetween a useful filter circuit capacitance, and input means for supplying to said filter a signal having substantial components with frequencies comparable to the inverse of the RC time constant of said filter, whereby such components are filtered.

4. The combination of claim 3 in which the channel has a resistivity of between 200 and 600 ohms per square and a thickness of between 1 and 2 microns and the operating range is between plus and minus ten volts.

* * * * *